(12) United States Patent
Tamagawa et al.

(10) Patent No.: US 9,837,297 B2
(45) Date of Patent: Dec. 5, 2017

(54) TRAY AND WAFER HOLDING APPARATUS

(71) Applicant: SHINKO ELECTRIC INDUSTRIES CO., LTD., Nagano (JP)

(72) Inventors: Koki Tamagawa, Nagano (JP); Norio Shiraiwa, Nagano (JP); Tadayoshi Yoshikawa, Nagano (JP); Naoto Watanabe, Nagano (JP); Miki Saito, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 317 days.

(21) Appl. No.: 14/732,868

(22) Filed: Jun. 8, 2015

(65) Prior Publication Data

US 2015/0371885 A1 Dec. 24, 2015

(30) Foreign Application Priority Data

Jun. 23, 2014 (JP) .................................. 2014-128275

(51) Int. Cl.
*H01L 21/683* (2006.01)
*H01L 21/67* (2006.01)
*H01L 21/687* (2006.01)

(52) U.S. Cl.
CPC .... *H01L 21/6833* (2013.01); *H01L 21/67109* (2013.01); *H01L 21/6875* (2013.01); *H01L 21/68771* (2013.01)

(58) Field of Classification Search
CPC .................................................. H01L 21/6833
See application file for complete search history.

(56) References Cited

U.S. PATENT DOCUMENTS

| 7,667,945 | B2* | 2/2010 | Wieland | H01L 21/6833 |
| | | | | 361/234 |
| 2004/0223285 | A1* | 11/2004 | Kano | H01L 21/67098 |
| | | | | 361/234 |
| 2008/0217291 | A1* | 9/2008 | Higuma | H01J 37/20 |
| | | | | 216/38 |

FOREIGN PATENT DOCUMENTS

JP H03-003250 1/1991

* cited by examiner

*Primary Examiner* — Scott Bauer
(74) *Attorney, Agent, or Firm* — IPUSA, PLLC

(57) ABSTRACT

A tray includes a support base having both a first face on which a clamp object is placed and a second face opposite the first face, an upper electrode embedded in the support base and situated toward the first face, a lower electrode embedded in the support base and situated further toward the second face than the upper electrode is, and one or more interconnect lines configured to provide an electrical connection between the upper electrode and the lower electrode.

13 Claims, 7 Drawing Sheets

TRAY AND WAFER HOLDING APPARATUS

CROSS-REFERENCE TO RELATED APPLICATIONS

The present application is based upon and claims the benefit of priority from the prior Japanese Patent Application No. 2014-128275 filed on Jun. 23, 2014, with the Japanese Patent Office, the entire contents of which are incorporated herein by reference.

FIELD

The disclosures herein relate to a tray for an electrostatic chuck and a wafer holding apparatus.

BACKGROUND

A film deposition apparatus (e.g., a chemical vapor deposition apparatus, a physical vapor deposition apparatus, or the like) and a plasma etching apparatus are used in the process of manufacturing a semiconductor device such as an IC (integrated circuit) and an LSI (large scale integration). These apparatuses have a stage for holding a wafer (e.g., a silicon wafer) in place with high accuracy in a vacuum processing chamber. An example of such a stage is a wafer holding apparatus that clamps a wafer with an electrostatic chuck.

A certain type of wafer holding apparatus utilizes a tray that is placed between an electrostatic chuck and a clamp object. The tray of this wafer holding apparatus has an electrode inside the tray or on the back face of the tray, so that the tray is securely held on the electrostatic chuck by a clamping force between the electrostatic chuck and the electrode of the tray (Patent Document 1, for example).

The arrangement of the electrode in the wafer holding apparatus noted above does not provide a sufficient clamping force to hold the tray on the electrostatic chuck as well as to clamp an object on the tray.

It may be desirable to provide a tray for an electrostatic chuck that is placed between an electrostatic chuck and a clamp object to provide a sufficient clamping force to clamp the object.

RELATED-ART DOCUMENTS

Patent Document

[Patent Document 1] Japanese Laid-open Patent Publication No. H3-3250

SUMMARY

According to an aspect of the embodiment, a tray includes a support base having both a first face on which a clamp object is placed and a second face opposite the first face, an upper electrode embedded in the support base and situated toward the first face, a lower electrode embedded in the support base and situated further toward the second face than the upper electrode is, and one or more interconnect lines configured to provide an electrical connection between the upper electrode and the lower electrode.

According to an aspect of the embodiment, a wafer holding apparatus includes an electrostatic chuck including a support base and an electrostatic electrode embedded therein, and a tray which includes a support base having both a first face on which a clamp object is placed and a second face opposite the first face, an upper electrode embedded in the support base of the tray and situated toward the first face, a lower electrode embedded in the support base of the tray and situated further toward the second face than the upper electrode is, and one or more interconnect lines configured to provide an electrical connection between the upper electrode and the lower electrode, and wherein the electrostatic electrode and the lower electrode are disposed to face each other, and the tray is configured to be placed on an upper face of the support base of the electrostatic chuck in a detachable manner.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described by referring to the accompanying drawings. In these drawings, the same elements are referred to by the same references, and a duplicate description thereof may be omitted.

First Embodiment

Figure 1A:
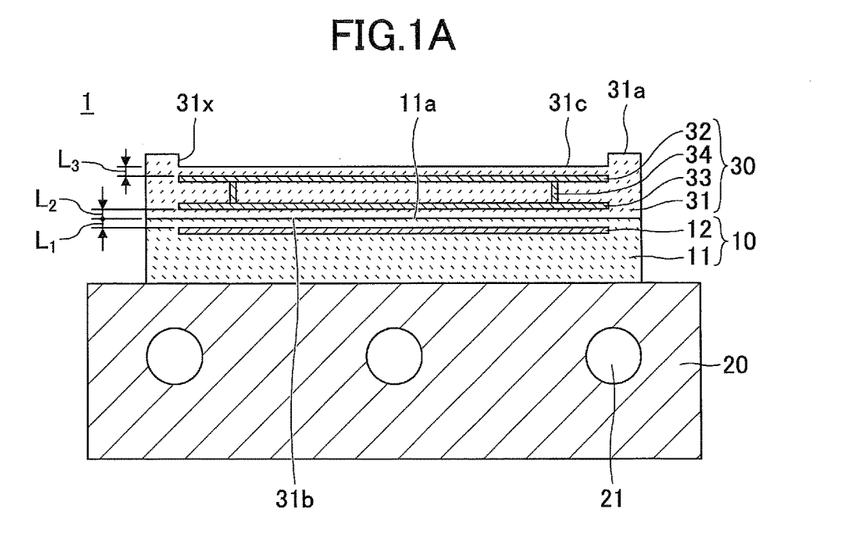
FIGS. 1A and 1B are drawings providing schematic illustrations of a wafer holding apparatus according to a first embodiment.
Figure 1B:
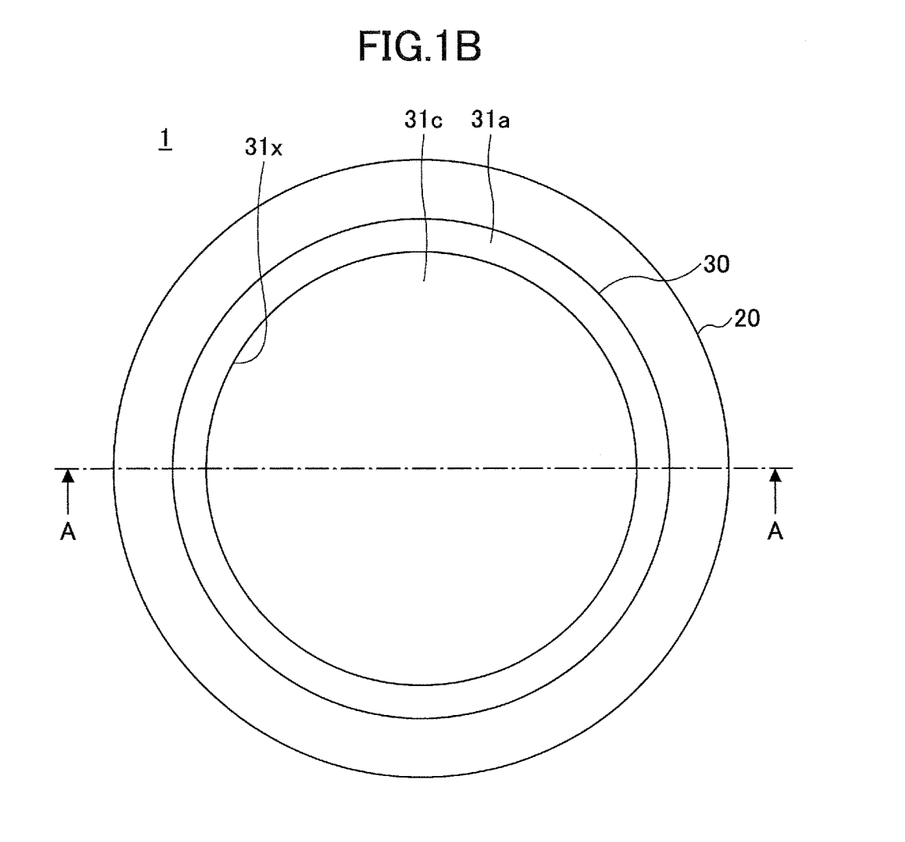

FIGS. 1A and 1B are drawings providing schematic illustrations of a wafer holding apparatus according to a first embodiment. FIG. 1B illustrates a plan view, and FIG. 1A illustrates a cross-sectional view taken along a line A-A in FIG. 1B. A wafer holding apparatus 1 illustrated in FIGS. 1A and 1B includes an electrostatic chuck 10, a base plate 20, and a tray 30 for use with the electrostatic chuck 10.

The electrostatic chuck 10 includes a support base 11 and an electrostatic electrode 12. The electrostatic chuck 10 may be a Johnsen-Rahbeck electrostatic chuck.

The support base 11 is made of dielectric material. The support base 11 is fixedly mounted on the base plate 20 by use of a silicone adhesive or the like (not shown) having a good thermal conductivity. The support base 11 may be made of ceramics of aluminum oxide ($Al_2O_3$), aluminum nitride (AlN), or the like. The thickness of the support base 11 may be in a range of approximately 1 mm to 5 mm. The relative permittivity of the support base 11 at 1 kHz may be in a range of approximately 9 to 10.

The electrostatic electrode 12 is a thin-film electrostatic chuck that is embedded in the support base 11. The electrostatic electrode 12 is coupled to a direct-current power supply (not shown) provided outside the wafer holding apparatus 1. Upon receiving a predetermined voltage, the electrostatic electrode 12 generates an electrostatic-based clamping force with respect to the tray 30, thereby clamping the tray 30. The clamping force increases as the voltage applied to the electrostatic electrode 12 increases. The electrostatic electrode 12 may have either a monopole structure or a dipole structure. Tungsten, molybdenum, or the like may be used as the material of the electrostatic electrode 12.

The base plate 20 serves to support the electrostatic chuck 10. The base plate 20 has a coolant water pathway 21 and a heater (not shown) to control the temperature of the support base 11 and the tray 30. Aluminum or the like may be used as the material of the base plate 20. Upon receiving voltage, the heater generates heat to heat the support base 11 and the tray 30.

The coolant water pathway 21 is connected to a coolant water control apparatus (not shown) provided outside the wafer holding apparatus 1. The coolant water control apparatus supplies coolant water to the coolant water pathway 21 through the coolant water inlet (not shown) of the base plate 20. The coolant water is discharged from the coolant water outlet (not shown). Coolant water circulates through the coolant water pathway 21 to cool the base plate 20, thereby cooling the support base 11 and the tray 30.

The support base 11 and the base plate 20 may have a gas pathway formed therein. The gas pathway may include a gas inlet formed at the bottom face of the base plate 20 and a gas outlet formed at an upper face 11a of the support base 11. The gas inlet is connected to a gas pressure control apparatus (not shown) provided outside the wafer holding apparatus 1. The gas pressure control apparatus introduces an inactive gas into the gas pathway through the gas inlet, thereby enabling the cooling of the support base 11 and the tray 30.

The tray 30 receives thereon and clamps an object such as a silicon wafer, a sapphire wafer, a silicon carbide (SiC) wafer, a gallium nitride (GaN) wafer, a glass wafer, or the like. The tray 30 is placed on the upper face 11a of the support base 11 of the electrostatic chuck 10 in a detachable manner. The phrase "detachable manner" refers to the fact that the tray 30 is easily detached from and attached to the electrostatic chuck 10 when no voltage is applied to the electrostatic electrode 12 while the tray 30 is not detachable when clamped by the electrostatic chuck 10 upon application of voltage to the electrostatic electrode 12.

The tray 30 includes a support base 31, and also includes an upper electrode 32, a lower electrode 33, and interconnection lines 34, all of which are embedded in the support base 31. The support base 31 may be made of dielectric material such as ceramics of aluminum oxide ($Al_2O_3$), aluminum nitride (AlN), or the like. The support base 31 has an upper face 31a and a lower face 31b. The upper face 31a of the support base 31 has a recess 31x formed therein to enable the positioning of a clamp object. The bottom face of the recess 31x serves as a placement surface 31c on which a clamp object is placed. The depth of the recess 31x (i.e., the distance between the upper face 31a of the support base 31 and the placement surface 31c) may be determined according to the size of a clamp object, and may be in a range of 0.8 mm to 1.5 mm, for example. The thickness of the support base 31 (i.e., the distance between the placement surface 31c and the lower face 31b situated opposite from the placement surface 31c) may be in a range of approximately 2 mm to 3 mm, for example. The relative permittivity of the support base 31 at 1 kHz may be in a range of approximately 9 to 10.

The upper electrode 32 is embedded in the support base 31 and situated toward the placement surface 31c. The lower electrode 33 is embedded in the support base 31 and situated further toward the lower face 31b than the upper electrode 32. In other words, the upper electrode 32 may be embedded in the support base 31 and situated closer to a clamp object than the halfway point in the thickness direction thereof, and the lower electrode 33 may be embedded in the support base 31 and situated closer to the electrostatic chuck 10 than the halfway point in the thickness direction thereof. In this manner, the upper electrode 32 and the lower electrode 33 are embedded in the support base 31 at different positions in the thickness direction thereof, and are electrically coupled to each other through the interconnection lines 34. The upper electrode 32 is arranged such as to face a clamp object placed on the placement surface 31c. The lower electrode 33 is arranged such as to face the electrostatic electrode 12 of the electrostatic chuck 10 (but not electrically coupled to the electrostatic electrode 12).

The tray 30 may be manufactured by a conventional method in which grooves and penetrating holes are formed in a plurality of green sheets, and are filled with conductive paste or the like to form electrodes, followed by laminating and sintering the green sheets.

Figure 2A:
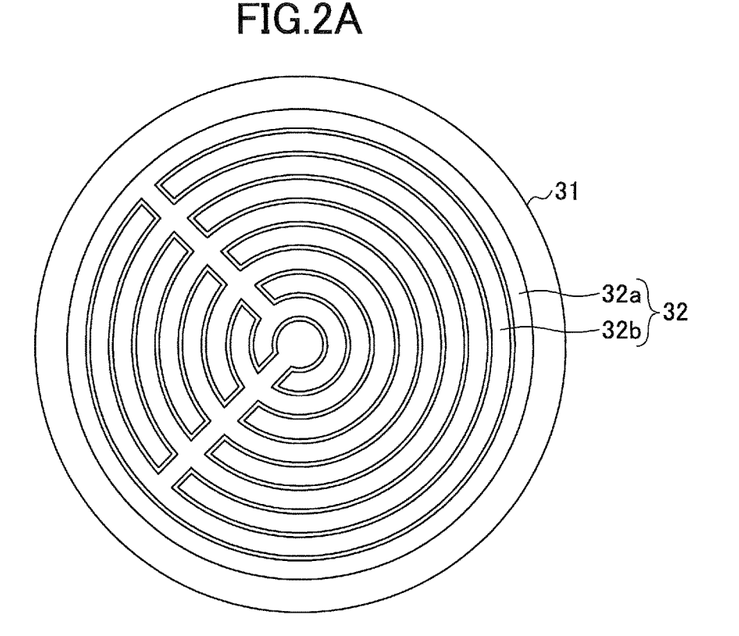
FIGS. 2A and 2B are plan views illustrating an example of an upper electrode and a lower electrode, respectively, according to the first embodiment.
Figure 2B:
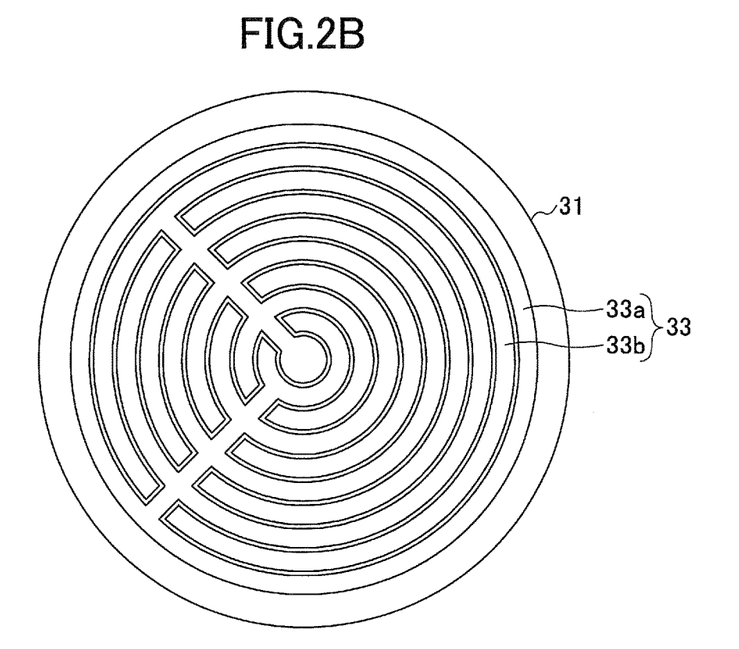

FIGS. 2A and 2B are plan views illustrating an example of the upper electrode and the lower electrode, respectively, according to the first embodiment. As illustrated in FIG. 2A, the upper electrode 32 may include dipole electrode parts each of which may have a spiral shape or a multiple concentric ring shape. Two electrodes 32a and 32b that constitute the dipole electrode parts are staggered with each other in the radial direction. Similarly, as illustrated in FIG. 2B, the lower electrode 33 may include dipole electrode parts each of which may have a spiral shape or a multiple concentric ring shape. Two electrodes 33a and 33b that constitute the dipole electrode parts are staggered with each other in the radial direction.

The respective dipole electrode structures of the upper electrode 32 and the lower electrode 33 may have either the same spatial pattern or different spatial patterns as long as these structures are connectable to each other through the interconnection lines 34. Further, the upper electrode 32 and the lower electrode 33 are not limited to a dipole electrode structure, but may have a monopole electrode structure. Tungsten, molybdenum, or the like may be used as the material of the upper electrode 32 and the lower electrode 33.

The lower electrode 33 is situated such as to face the electrostatic electrode 12 of the electrostatic chuck 10. The respective dipole structures of the lower electrode 33 and the electrostatic electrode 12 may have either the same spatial pattern or different spatial patterns. Further, the lower electrode 33 and the electrostatic electrode 12 are not limited to a dipole electrode structure, but may have a monopole electrode structure.

Figure 3:
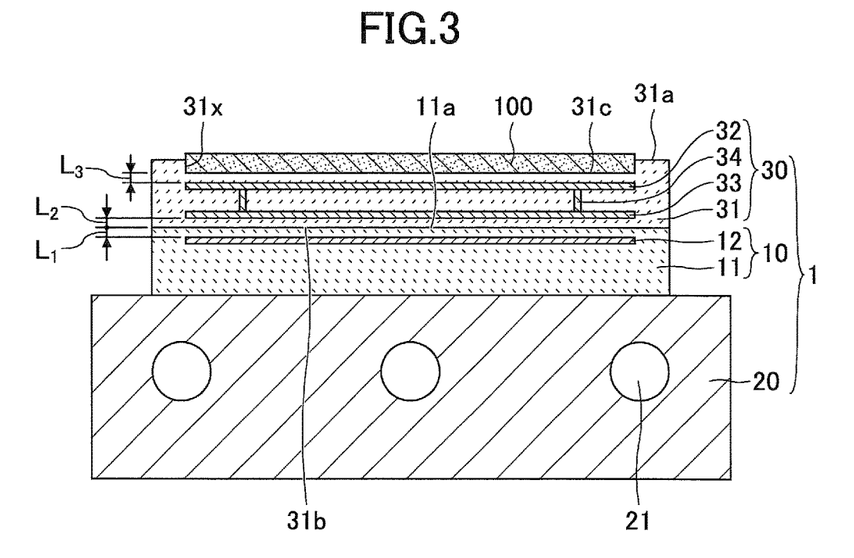
FIG. 3 is a cross-sectional view illustrating the wafer holding apparatus of the first embodiment on which a clamp object is placed.

FIG. 3 is a cross-sectional view illustrating the wafer holding apparatus 1 of the first embodiment on which a clamp object is placed. When voltage is applied to the electrostatic electrode 12 of the electrostatic chuck 10 in FIG. 3, an electrostatic potential is generated at the electrostatic electrode 12. The electrostatic potential of the electrostatic electrode 12 is transmitted through the lower face 31b to the lower electrode 33 opposed in close proximity to the electrostatic electrode 12. With this arrangement, an electrostatic clamping force is generated between the electrostatic electrode 12 and the lower electrode 33, so that the tray 30 is clamped to the electrostatic chuck 10.

The electrostatic potential transmitted from the electrostatic electrode 12 to the lower electrode 33 is distributed to the upper electrode 32 through the interconnection lines 34. As a result, an electrostatic clamping force is generated between the upper electrode 32 and a clamp object 100 (e.g., silicon wafer), so that the clamp object 100 is clamped to the placement surface 31c of the tray 30.

In order to secure a sufficient electrostatic clamping force between the electrostatic electrode 12 and the lower electrode 33, a distance $L_1$ between the upper face 11a of the support base 11 and the upper face of the electrostatic electrode 12 as well as a distance $L_2$ between the lower face 31b of the support base 31 and the lower face of the lower electrode 33 are preferably as short as possible. In order to secure a sufficient electrostatic clamping force between the upper electrode 32 and the clamp object 100, further, a distance $L_3$ between the placement surface 31c of the support base 31 and the upper face of the upper electrode 32 is preferably as short as possible. To be more specific, the distances $L_1$, $L_2$, and $L_3$ are preferably shorter than 0.5 mm.

Figure 4:
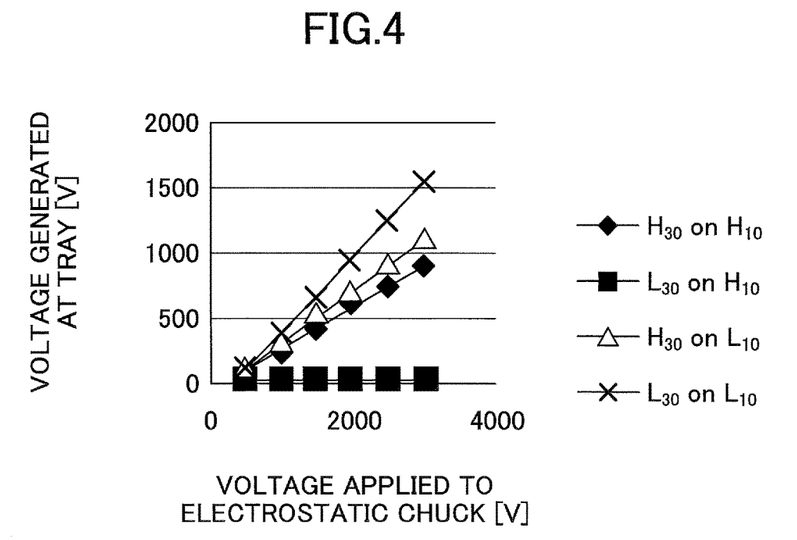
FIG. 4 is a drawing illustrating the results of an experiment concerning the relationships between voltage applied to an electrostatic chuck and voltage generated at a tray.

In the following, a description will be given of the results of an experiment that was conducted with respect to the relationship between the voltage applied to the electrostatic chuck 10 (i.e., voltage applied to the electrostatic electrode 12) and the voltage generated at the placement surface 31c of the tray 30. In this experiment, aluminum oxide ($Al_2O_3$) was used as the material of the support base 11 of the electrostatic chuck 10 and the material of the support base 31 of the tray 30.

An electrostatic chuck 10 (referred to as a sample $H_{10}$) was used of which the distance $L_1$ was 0.4 mm, and the surface roughness of the upper face 11a of the support base 11 was expressed as Ra=0.6 micrometers, with the volume resistivity of the support base 11 being $10^{15}$ Ωcm (at room temperature with 1000 V being applied). Further, an electrostatic chuck 10 (referred to as a sample $L_{10}$) was used of which the distance $L_1$ was 0.4 mm, and the surface roughness of the upper face 11a of the support base 11 was expressed as Ra=0.6 micrometers, with the volume resistivity of the support base 11 being $10^{11}$ Ωcm (at room temperature with 1000 V being applied).

A tray 30 (referred to as a sample $H_{30}$) was also used of which the distance $L_2$ and the distance $L_3$ were 0.4 mm, and the surface roughness of the placement surface 31c and the lower face 31b of the support base 31 were expressed as Ra=0.6 micrometers, with the volume resistivity of the support base 31 being $10^{15}$ Ωcm (at room temperature with 1000 V being applied). Further, a tray 30 (referred to as a sample $L_{30}$) was used of which the distance $L_2$ and the distance $L_3$ were 0.4 mm, and the surface roughness of the placement surface 31c and the lower face 31b of the support base 31 were expressed as Ra=0.6 micrometers, with the volume resistivity of the support base 31 being $10^{11}$ Ωcm (at room temperature with 1000 V being applied).

The relationships between the voltage applied to the electrostatic chuck 10 (i.e., voltage applied to the electrostatic electrode 12) and the voltage generated at the placement surface 31c of the tray 30 were measured with respect to a case ($H_{30}$ on $H_{10}$) in which the sample $H_{30}$ was placed on the sample $H_{10}$, a case ($L_{30}$ on $H_{10}$) in which the sample $L_{30}$ was placed on the sample $H_{10}$, a case ($H_{30}$ on $L_{10}$) in which the sample $H_{30}$ was placed on the sample $L_{10}$, and a case ($L_{30}$ on $L_{10}$) in which the sample $L_{30}$ was placed on the sample $L_{10}$.

The results revealed that the case $L_{30}$ on $L_{10}$, namely, the case in which the volume resistivity was lower with respect to both the electrostatic chuck 10 and the tray 30, allows electrostatic potential to be most efficiently transmitted from the electrostatic chuck 10 to the tray 30. This may be attributable to the fact that a decrease in the volume resistivity makes it easier for a surface potential to occur due to leak current.

In the present disclosures, dielectric material whose volume resistivity is larger than or equal to $10^{13}$ Ωcm (at room temperature with 1000 V being applied) is referred to as a high-resistance dielectric material, and dielectric material whose volume resistivity is smaller than $10^{13}$ Ωcm (at room temperature with 1000 V being applied) is referred to as a low-resistance dielectric material. The results noted above thus may be rephrased as follows: the use of the low-resistance dielectric material for both the electrostatic chuck 10 and the tray 30 allows electrostatic potential to be most efficiently transmitted from the electrostatic chuck 10 to the tray 30.

Further experiments also revealed that the use of the low-resistance dielectric material for both the electrostatic chuck 10 and the tray 30, together with a further arrangement as in the following, enabled the more efficient transfer of electrostatic potential. Namely, the more efficient transfer of electrostatic potential was confirmed when the distance $L_1$, $L_2$ and $L_3$ were decreased, and the surface roughness of the upper face 11a of the support base 11 and the placement surface 31c and lower face 31b of the support base 31 was decreased.

Specifically, the more efficient transfer of electrostatic potential was confirmed when the distance $L_1$, $L_2$ and $L_3$ were set smaller than or equal to 0.3 mm, and the surface roughness Ra of the upper face 11a of the support base 11 as well as the placement surface 31c and lower face 31b of the support base 31 was set smaller than or equal to 0.2 micrometers. Setting the surface roughness Ra of the upper face 11a of the support base 11 as well as the placement surface 31c and lower face 31b of the support base 31 to a value smaller than or equal to 0.2 micrometers may be achieved by grinding with a lapping machine or the like the upper face 11a of the support base 11 as well as the placement surface 31c and lower face 31b of the support base 31.

In this manner, the wafer holding apparatus 1 of the first embodiment has the upper electrode 32 embedded in the support base 31 of the tray 30 at a position closer to a clamp object than to the opposite face, and also has the lower electrode 33 embedded in the support base 31 at a position closer to the electrostatic chuck 10 than to the opposite face, with the upper electrode 32 and the lower electrode 33 being electrically coupled to each other. The tray 30 is then placed on the electrostatic chuck 10.

In this state, voltage is applied to the electrostatic electrode 12 of the electrostatic chuck 10 to generate an electrostatic potential at the electrostatic electrode 12. The electrostatic potential is then transmitted to the lower electrode 33 that is opposed in close proximity to the electrostatic electrode 12. An electrostatic clamping force is thus generated between the electrostatic electrode 12 and the lower electrode 33, so that the tray 30 is clamped to the electrostatic chuck 10.

The electrostatic potential transmitted from the electrostatic electrode 12 to the lower electrode 33 is distributed to the upper electrode 32 through the interconnection lines 34. As a result, an electrostatic clamping force is generated between the upper electrode 32 and the clamp object 100 (e.g., silicon wafer), so that the clamp object 100 is clamped to the placement surface 31c of the tray 30.

The upper electrode 32 for clamping the clamp object 100 and the lower electrode 33 for clamping with the electrostatic chuck 10 are disposed in the tray 30. Unlike the configuration in which only one electrode is embedded in the tray 30, this arrangement allows the distance between the clamp object 100 and the upper electrode 32 and the distance between the electrostatic chuck 10 and the lower electrode 33 to be optimized independently of each other, thereby easily providing desired clamping forces.

Further, the tray 30 is securely clamped while the clamp object 100 is clamped in place, which allows both the tray 30 and the clamp object 100 to be simultaneously cooled by the electrostatic chuck 10. This enables the stable control of temperature of the clamp object 100. Because of this, during the manufacturing of a light emitting diode, variation in the etching rate of an etched layer may be suppressed in the process of etching the layer that is formed on a sapphire substrate serving as a clamp object 100. This serves to improve the yield of the etching process.

Moreover, the tray 30 is detachably placed on the electrostatic chuck 10. With this arrangement, the tray 30 may simply be switched to another tray (e.g., a tray 30A that will be described later) to enable the placement of another clamp object having a different size. This arrangement also allows the number of clamp objects to be changed.

The upper electrode 32 and lower electrode 33 are embedded in the tray 30, and are not exposed to outside the tray 30. An alternative configuration may have a metal film serving as a lower electrode that is disposed on the lower face 31b of the support base 31 of the tray 30, for example. In such a configuration, there is a risk of having the metal film contaminated by plasma or the like. The tray 30 disclosed herein, however, has no metal films exposed to outside, and is thus free of a risk of contamination of the metal films.

<First Variation of First Embodiment>

A first variation of the first embodiment is directed to a wafer holding apparatus that has a plurality of upper electrodes, and that allows a plurality of clamp objects to be placed on a placement surface over (i.e., directly above) the respective positions of the upper electrodes. In connection with the first variation of the first embodiment, a description of the same or similar components as those of the previously provided descriptions may be omitted as appropriate.

Figure 5A:
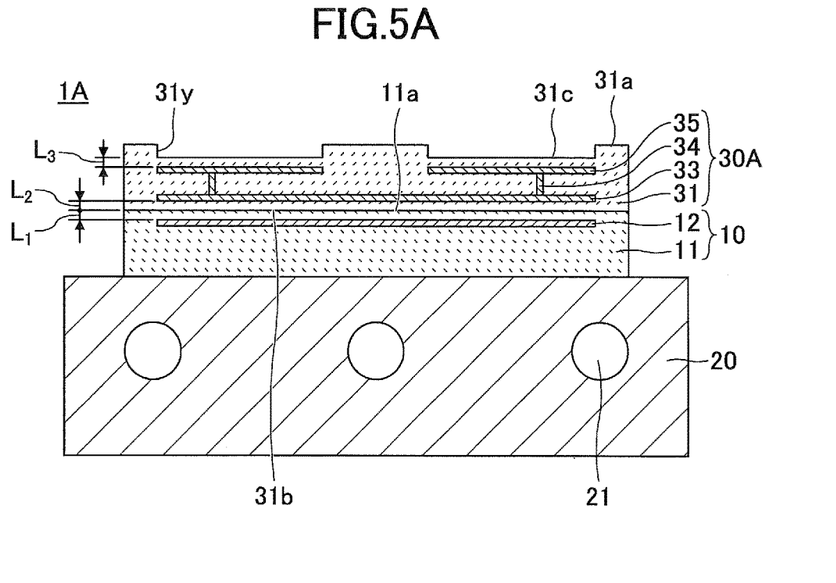
FIGS. 5A and 5B are drawings providing schematic illustrations of a wafer holding apparatus according to a first variation of the first embodiment.
Figure 5B:
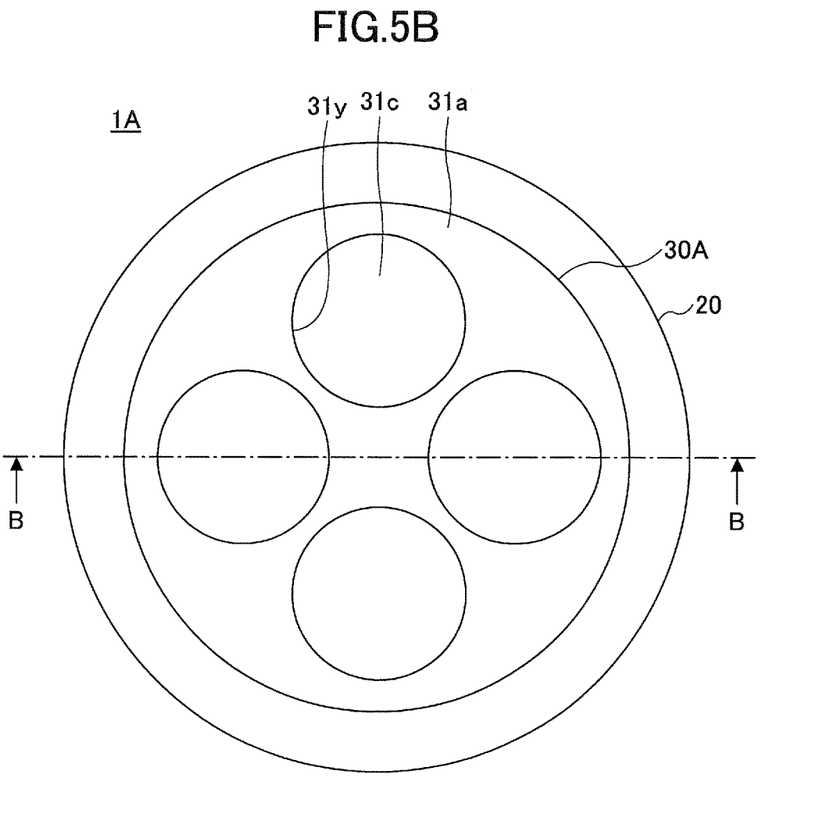

FIGS. 5A and 5B are drawings providing schematic illustrations of a substrate holding apparatus according to a first variation of the first embodiment. FIG. 5B illustrates a plan view, and FIG. 5A illustrates a cross-sectional view taken along a line B-B in FIG. 5B. In FIGS. 5A and 53, a wafer holding apparatus 1A differs from the wafer holding apparatus 1 (see FIGS. 1A and 1B and the like) in that the tray 30 is replaced with a tray 30A.

The tray 30A is similar to the tray 30 (see FIGS. 1A and 1B and the like) in that the tray 30A serves to clamp a silicon wafer or the like placed thereon as a clamp object. The tray 30A is placed on the upper face 11a of the support base 11 of the electrostatic chuck 10 in a detachable manner. The tray 30A is configured to simultaneously clamp four clamp objects at the maximum.

The tray 30A includes a support base 31, and also includes four upper electrodes 35, a lower electrode 33, and interconnection lines 34, all of which are embedded in the support base 31. The upper face 31a of the support base 31 has four recesses 31y for positioning clamp objects. The bottom face of each of the recesses 31y serves as a placement surface 31c on which a clamp object is placed. The depth of the recesses 31y (i.e., the distance between the upper face 31a of the support base 31 and the placement surface 31c) may be determined according to the size of a clamp object, and may be in a range of 0.8 mm to 1.5 mm, for example.

The upper electrodes 35 are embedded in the support base 31 and situated toward the placement surfaces 31c. The lower electrode 33 is embedded in the support base 31 and situated further toward the lower face 31b than are the upper electrodes 35. In other words, the upper electrodes may be embedded in the support base 31 and situated closer to clamp objects than the halfway point in the thickness direction thereof, and the lower electrode 33 may be embedded in the support base 31 and situated closer to the electrostatic chuck 10 than the halfway point in the thickness direction thereof. In this manner, each of the upper electrodes 35 and the lower electrode 33 are embedded in the support base 31 at different positions in the thickness direction thereof, respectively, and are coupled to each other through the interconnection lines 34. The upper electrodes are disposed to face respective clamp objects placed on the placement surfaces 31c of the respective recesses 31y. The lower electrode 33 is arranged such as to face the electrostatic electrode of the electrostatic chuck 10 (but not electrically coupled to the electrostatic electrode 12).

Figure 6A:
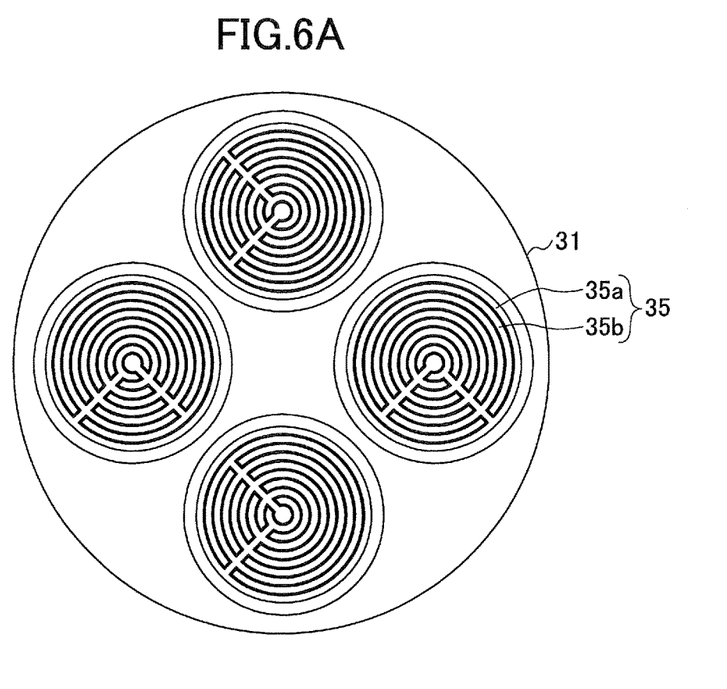
FIGS. 6A and 6B are plan views illustrating an example of the upper electrodes and the lower electrode, respectively, according to the first variation of the first embodiment.
Figure 6B:
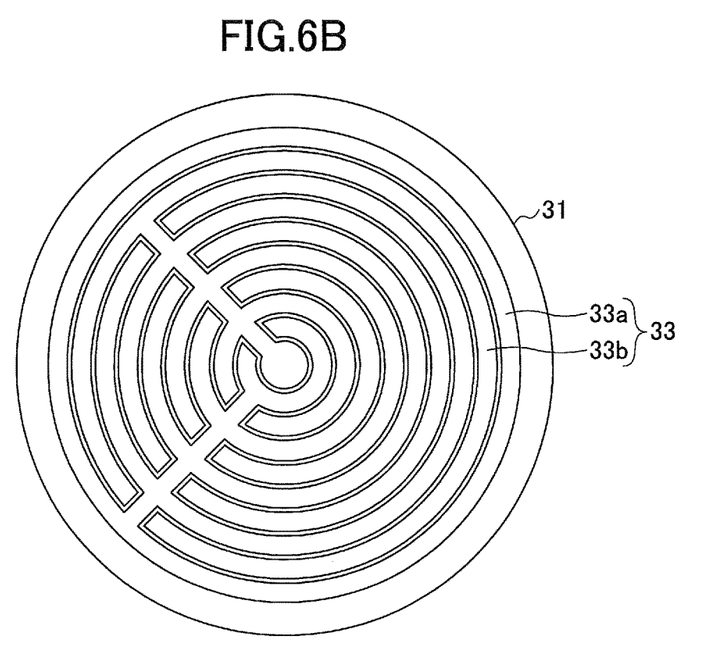

FIGS. 6A and 6B are plan views illustrating an example of the upper electrodes and the lower electrode, respectively, according to the first variation of the first embodiment. As illustrated in FIG. 6A, each of the upper electrodes 35 may include dipole electrode parts each of which may have a spiral shape or a multiple concentric ring shape. Two electrodes 35a and 35b that constitute the dipole electrode parts are staggered with each other in the radial direction. Similarly, as illustrated in FIG. 6B, the lower electrode 33 may include dipole electrode parts each of which may have a spiral shape or a multiple concentric ring shape. Two electrodes 33a and 33b that constitute the dipole electrode parts are staggered with each other in the radial direction.

The respective dipole electrode structures of the upper electrodes 35 and the lower electrode may have either the same spatial pattern or different spatial patterns as long as these structures are connectable to each other through the interconnection lines 34. Further, the upper electrodes 35 and the lower electrode 33 are not limited to a dipole electrode structure, but may have a monopole electrode structure. Tungsten, molybdenum, or the like may be used as the material of the upper electrodes 35 and the lower electrode 33.

Figure 7:
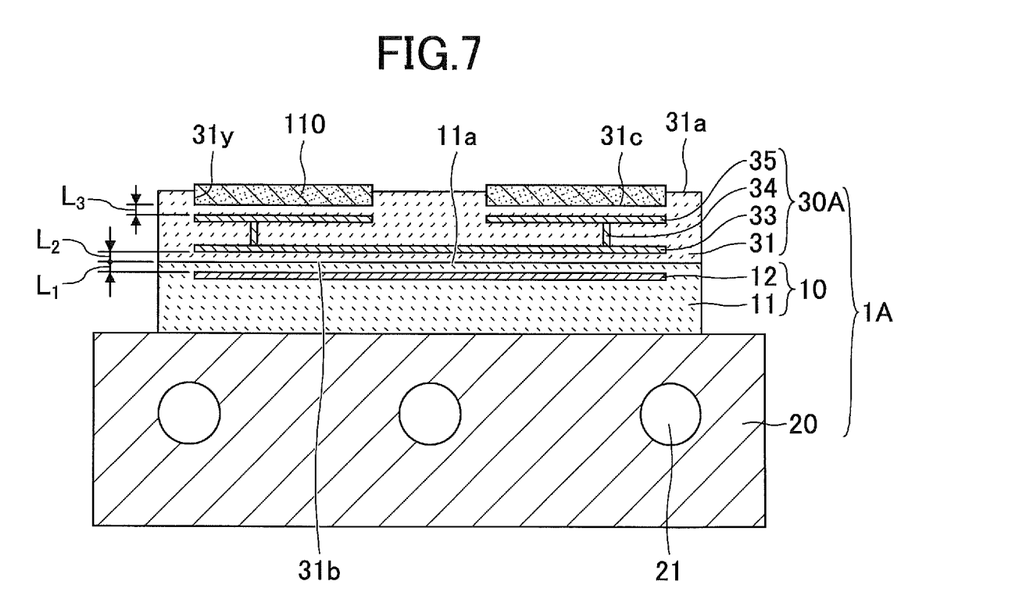
FIG. 7 is a cross-sectional view illustrating the wafer holding apparatus of the first variation of the first embodiment on which clamp objects are placed.

FIG. 7 is a cross-sectional view illustrating the wafer holding apparatus 1 of the first variation of the first embodiment on which clamp objects are placed. When voltage is applied to the electrostatic electrode 12 of the electrostatic chuck 10 in FIG. 7, an electrostatic potential is generated at the electrostatic electrode 12. The electrostatic potential of the electrostatic electrode 12 is transmitted to the lower electrode 33 opposed in close proximity to the electrostatic electrode 12. With this arrangement, an electrostatic clamping force is generated between the electrostatic electrode 12 and the lower electrode 33, so that the tray 30A is clamped to the electrostatic chuck 10.

The electrostatic potential transmitted from the electrostatic electrode 12 to the lower electrode 33 is distributed to the upper electrodes 35 through the interconnection lines 34. As a result, an electrostatic clamping force is generated between each of the upper electrodes 35 and clamp objects 110 (e.g., silicon wafer), so that the clamp objects 110 are clamped to the placement surface 31c of the tray 30. Similarly to the first embodiment, the distances $L_1$, $L_2$, and $L_3$ are preferably shorter than 0.5 mm.

In the wafer holding apparatus 1A, the number of recesses 31y and upper electrodes 35 is not limited to four, and may alternatively be two, three, or a number larger than four. The shapes of the recesses 31y do not have to be the same, and, similarly, the shapes of the upper electrodes 35 do not have to be the same.

As was described above, the wafer holding apparatus 1A of the first variation of the first embodiment has an advantage of being able to clamp a plurality of clamp objects simultaneously in addition to the advantages of the wafer holding apparatus 1 of the first embodiment.

<Second Variation of First Embodiment>

A second variation of the first embodiment is directed to a wafer holding apparatus that has a tray designed to improve cooling efficiency. In connection with the second variation of the first embodiment, a description of the same or similar components as those of the previously provided descriptions may be omitted as appropriate.

Figure 8A:
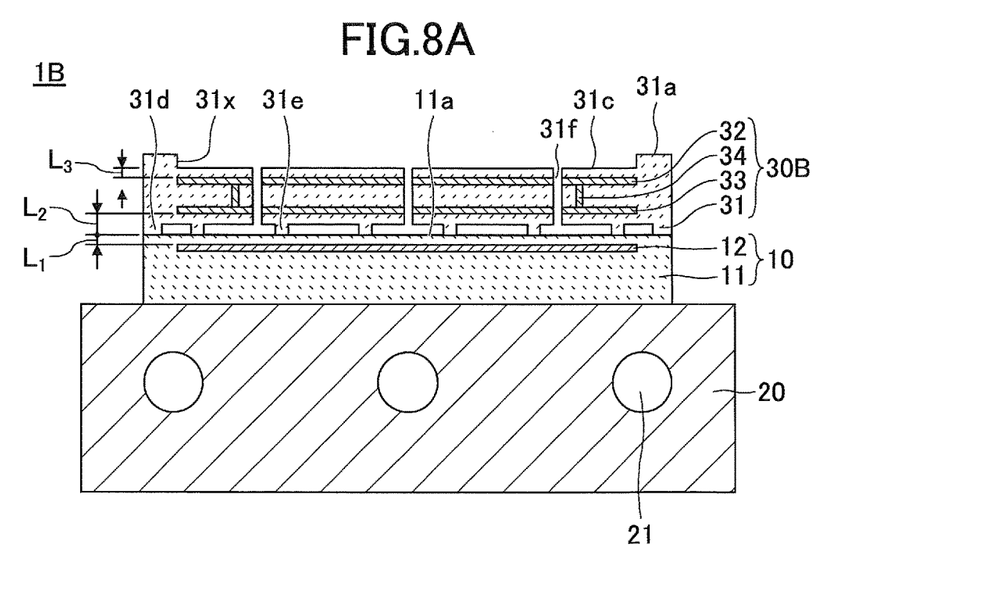
FIGS. 8A and 8B are drawings providing schematic illustrations of a wafer holding apparatus according to a second variation of the first embodiment.
Figure 8B:
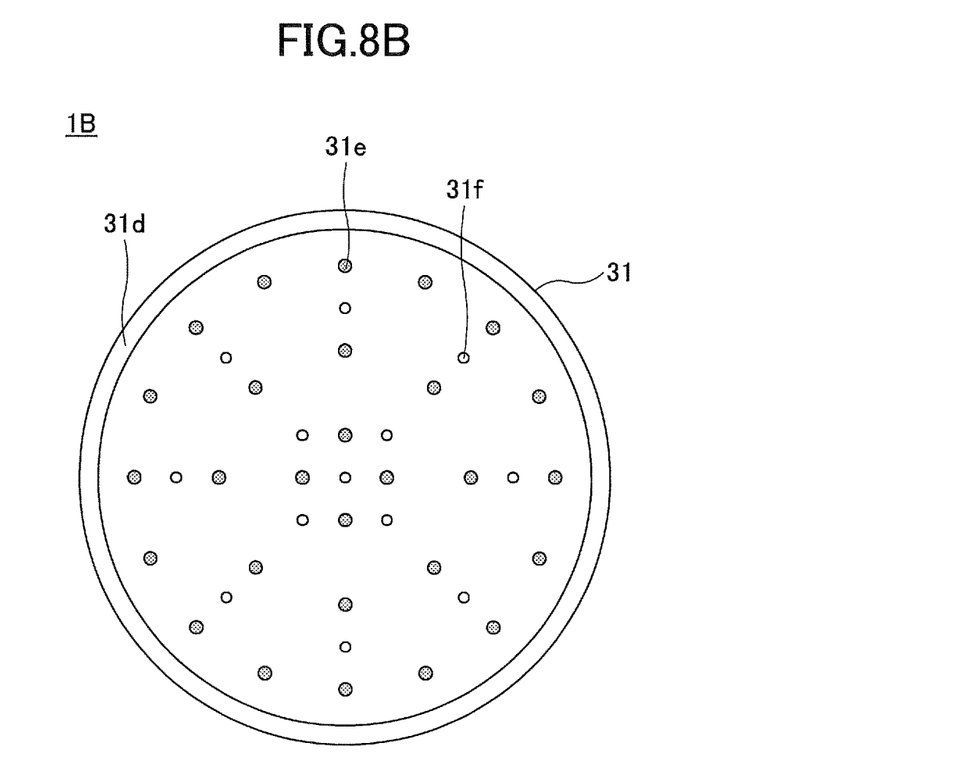

FIGS. 8A and 8B are drawings providing schematic illustrations of a substrate holding apparatus according to the second variation of the first embodiment. FIG. 8A illustrates a cross-sectional view corresponding to the view illustrated in FIG. 1A, and FIG. 8B illustrates a plan view of the support base of the tray. In FIG. 8B, projections 31e are illustrated in dotted texture for the sake of discriminating the projections 31e from penetrating holes 31f.

In FIGS. 8A and 8B, a wafer holding apparatus 1B differs from the wafer holding apparatus 1 (see FIGS. 1A and 1B and the like) in that the tray 30 is replaced with a tray 30B.

The bottom face of the tray 30B (i.e., the lower face of the support base 31) has a circular dam 31d formed at the perimeter thereof and a number of projections 31e formed inside the dam 31d. The projections 31e may be a circular cylinder, and may be scattered inside the dam 31d to form a polka dot pattern in a plan view. The projections 31e are not limited to a circular cylinder (i.e., circular in a plan view), and may be a cylinder having an ellipse shape in a plan view, a prism having a polygonal shape such as a hexagon in a plan view, a combination of a plurality of circular cylinders having different diameters, any combination of the noted shapes, or the like. The height of the dam 31d and the projections 31e may be several tens of micrometers, for example. The lower face of the dam 31d and the lower faces of the projections 31e are substantially flush with each other.

The provision of the dam 31d and the projections 31e at the bottom face of the tray 30B serves to provide a space (i.e., recess) inside the dam 31d except where the projections 31e are situated. Inactive gas (e.g., helium or the like) is supplied through a gas pathway (not shown) disposed in the support base 11 and the base plate 20, and fills the space provided at the bottom face of the tray 30B, thereby improving the cooling efficiency of the tray 30B.

The structure for providing a space filled with inactive gas may be any structure, and is not limited to the dam 31d and the projections 31e as long as a proper space is provided.

The tray 30B further has a number of penetrating holes 31f. Each of the penetrating holes 31f has one end thereof opening at the placement surface 31c and the other end thereof opening toward the space provided at the bottom face of the tray 303. The provision of the penetrating holes 31f in the tray 30B allows the inactive gas filling the space provided at the bottom face of the tray 30B to flow through the penetrating holes 31f to reach the placement surface 31c. This improves the efficiency of cooling a clamp object placed on the placement surface 31c.

As was described above, the wafer holding apparatus 1B of the second variation of the first embodiment has an advantage of being able to improve the cooling efficiency of the tray 305 in addition to the advantages of the wafer holding apparatus 1 of the first embodiment. Further, there is an advantage of being able to improve the efficiency of cooling a clamp object placed on the placement surface 31c.

Further, the present invention is not limited to these embodiments, but various variations and modifications may be made without departing from the scope of the present invention.

The embodiments and variations disclosed herein have been directed to an example in which a Johnsen-Rahbeck electrostatic chuck is used. This is not a limiting example, and the disclosed technology is equally applicable to a Coulomb electrostatic chuck.

It may further be noted that the disclosed embodiments and variations may be combined as appropriate. For example, the bottom face of the tray 30A of the wafer holding apparatus 1A according to the first variation of the first embodiment may be provided with a space to be filled with inactive gas as in the second variation of the first embodiment, and may also be provided with penetrating holes through which the inactive gas flows.

According to at least one embodiment, a tray for an electrostatic chuck is provided that is placed between an electrostatic chuck and a clamp object to provide a sufficient clamping force to clamp the object.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A tray, comprising:
a support base having both a first face on which a clamp object is placed and a second face opposite the first face;
an upper electrode embedded in the support base and situated toward the first face;
a lower electrode embedded in the support base and situated further toward the second face than the upper electrode is; and
one or more interconnect lines configured to provide an electrical connection between the upper electrode and the lower electrode, wherein the upper electrode and the lower electrode are fully enclosed in the support base, and are not exposed to an outside of the support base.

2. The tray as claimed in claim 1, wherein the support base, the upper electrode, and the lower electrode are configured to clamp the clamp object placed on the first face by way of application of electrostatic potential through the second face.

3. The tray as claimed in claim 1, wherein the support base is made of dielectric material whose volume resistivity is smaller than $10^{13}$ Ωcm.

4. The tray as claimed in claim 1, wherein the first face and the second face are faces having undergone grinding.

5. The tray as claimed in claim 1, wherein the upper electrode includes upper electrode parts, and the first face has a plurality of recesses situated directly above the upper electrode parts, respectively.

6. The tray as claimed in claim 1, wherein the second face has a recess for accommodating inactive gas.

7. The tray as claimed in claim 1, wherein the support base is made of dielectric material whose volume resistivity is smaller than $10^{13}$ Ω·cm, the dielectric material being in contact with upper and lower faces of the upper electrode and in contact with upper and lower faces of the lower electrode.

8. A wafer holding apparatus, comprising:
an electrostatic chuck including a support base and an electrostatic electrode embedded therein; and
a tray which includes:
a support base having both a first face on which a clamp object is placed and a second face opposite the first face;
an upper electrode embedded in the support base of the tray and situated toward the first face;
a lower electrode embedded in the support base of the tray and situated further toward the second face than the upper electrode is; and
one or more interconnect lines configured to provide an electrical connection between the upper electrode and the lower electrode,
wherein the electrostatic electrode and the lower electrode are disposed to face each other, and the tray is configured to be placed on an upper face of the support base of the electrostatic chuck in a detachable manner, and
wherein the upper electrode and the lower electrode are fully enclosed in the support base, and are not exposed to an outside of the support base.

9. The wafer holding apparatus as claimed in claim 8, wherein when the clamp object is placed on the first face, and voltage is applied to the electrostatic electrode, the lower electrode is attracted by the electrostatic electrode, so that the tray is clamped to the upper face of the support base of the electrostatic chuck, and the clamp object is attracted by the upper electrode, so that the clamp object is clamped to the first face.

10. The wafer holding apparatus as claimed in claim 8, wherein the support base of the electrostatic chuck is made of dielectric material whose volume resistivity is smaller than $10^{13}$ Ωcm.

11. The wafer holding apparatus as claimed in claim 8, wherein the upper face of the support base of the electrostatic chuck is a face having undergone grinding.

12. The wafer holding apparatus as claimed in claim 8, wherein the electrostatic chuck includes a gas pathway configured to supply inactive gas to the tray.

13. The wafer holding apparatus as claimed in claim 8, wherein the support base is made of dielectric material whose volume resistivity is smaller than $10^{13}$ Ω·cm, the dielectric material being in contact with upper and lower faces of the upper electrode and in contact with upper and lower faces of the lower electrode.

* * * * *